United States Patent
Hierlemann et al.

(10) Patent No.: US 6,876,026 B2
(45) Date of Patent: Apr. 5, 2005

(54) MEMORY CELL, WAFER, SEMICONDUCTOR COMPONENT WITH MEMORY CELL HAVING INSULATION COLLARS AND METHOD FOR FABRICATING AN INSULATING COLLAR FOR A MEMORY CELL

(75) Inventors: Matthias Hierlemann, München (DE); Rudolf Strasser, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/277,387

(22) Filed: Oct. 22, 2002

(65) Prior Publication Data

US 2003/0077873 A1 Apr. 24, 2003

(30) Foreign Application Priority Data

Oct. 22, 2001 (DE) .......................... 101 53 110

(51) Int. Cl.[7] .................. H01L 27/108; H01L 29/76; H01L 29/94; H01L 31/119
(52) U.S. Cl. .................. 257/301; 257/296; 257/300; 257/302; 257/303; 257/304; 257/305
(58) Field of Search ................ 257/300–305, 257/296

(56) References Cited

U.S. PATENT DOCUMENTS

| 5,770,484 A | | 6/1998 | Kleinhenz | |
|---|---|---|---|---|
| 6,004,844 A | * | 12/1999 | Alsmeier et al. | 438/246 |
| 6,027,494 A | | 2/2000 | Frey | |
| 6,190,988 B1 | | 2/2001 | Furukawa et al. | |
| 6,265,742 B1 | * | 7/2001 | Gruening et al. | 257/304 |
| 6,310,375 B1 | * | 10/2001 | Schrems | 257/301 |
| 6,329,703 B1 | * | 12/2001 | Schrems et al. | 257/636 |
| 6,335,247 B1 | * | 1/2002 | Tews et al. | 438/270 |
| 6,437,381 B1 | * | 8/2002 | Gruening et al. | 257/296 |
| 6,541,334 B2 | * | 4/2003 | Luetzen et al. | 438/243 |
| 6,638,814 B1 | * | 10/2003 | Kieslich et al. | 438/246 |
| 2002/0137278 A1 | * | 9/2002 | Temmler et al. | 438/243 |
| 2002/0182819 A1 | * | 12/2002 | Schrems et al. | 438/386 |
| 2003/0057483 A1 | * | 3/2003 | Bronner et al. | 257/330 |
| 2003/0080346 A1 | * | 5/2003 | Weis | 257/135 |

FOREIGN PATENT DOCUMENTS

| DE | 100 30 696 A1 | 1/2002 |
|---|---|---|
| DE | 100 45 694 A1 | 4/2002 |
| WO | WO 01/17019 A2 | 3/2001 |

* cited by examiner

*Primary Examiner*—Maria Guerrero
*Assistant Examiner*—Ida M. Soward
(74) *Attorney, Agent, or Firm*—Laurence A. Greenberg; Werner H. Stemer; Gregory L. Mayback

(57) ABSTRACT

The invention relates to a DRAM memory cell having a trench filled with conductive material connected to a selection transistor by a connection having a vertical insulation collar arranged perpendicularly to a layer sequence of the memory cell. The vertical insulation collar is connected to a lateral insulation collar of the trench. This lateral insulation collar essentially extends perpendicular to the vertical insulation collar or is arranged laterally with respect to the vertical insulation collar. It is thus possible to provide a memory cell, a wafer and a semiconductor component that have a high integration density and a sufficient dielectric strength, and that efficiently suppress parasitic transistors. A method for fabricating a lateral insulating collar for a memory cell is also described.

24 Claims, 7 Drawing Sheets

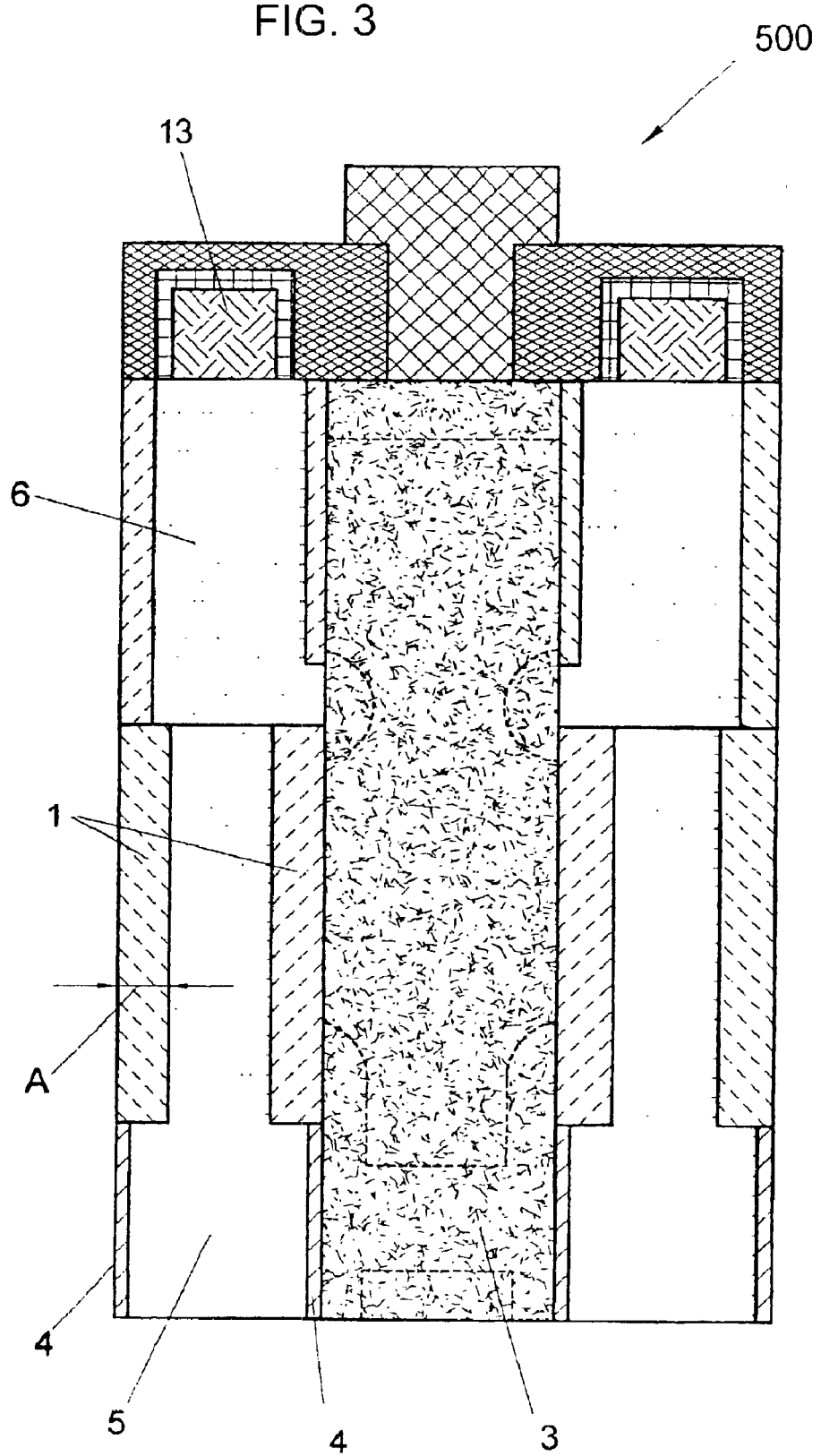

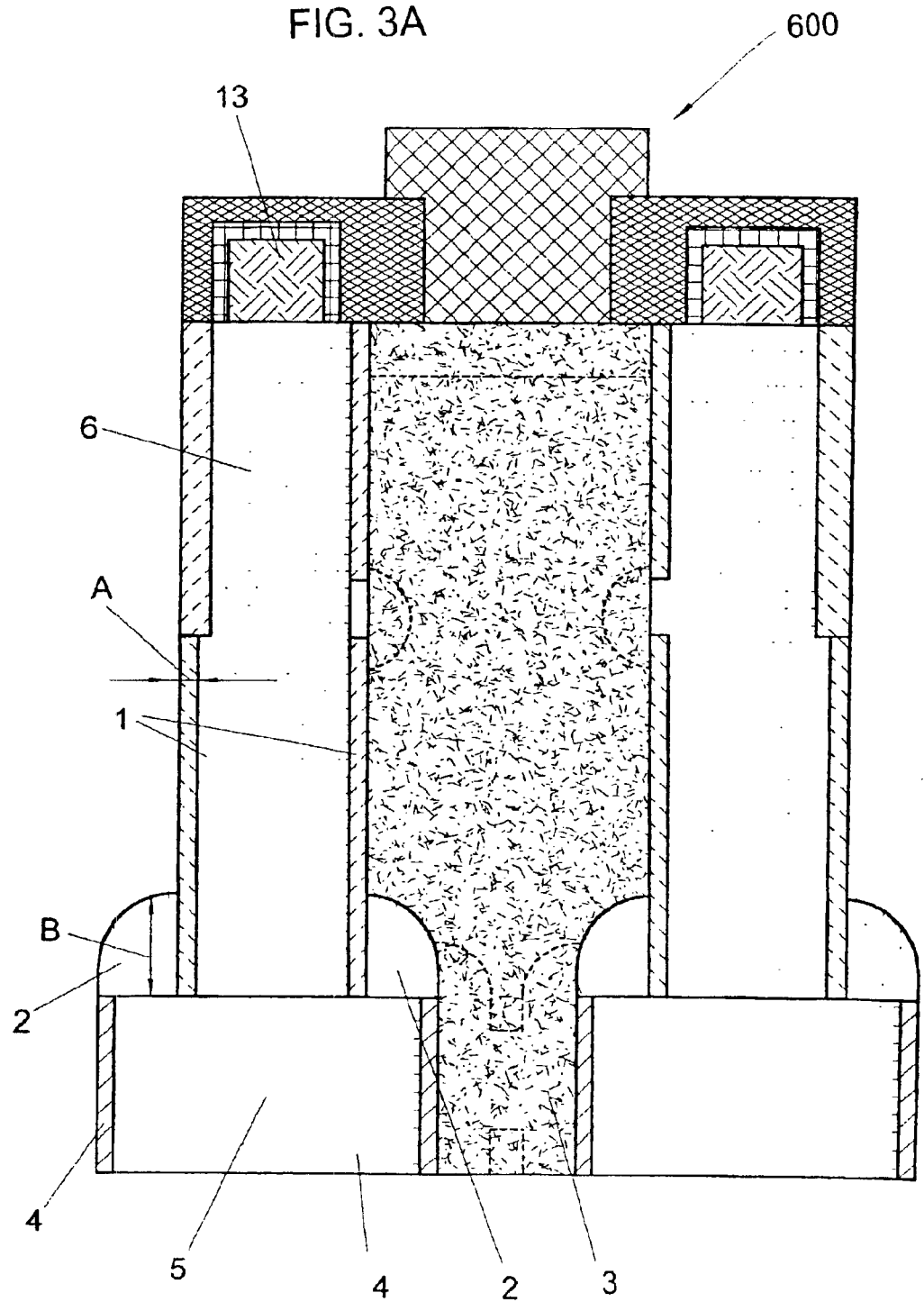

MEMORY CELL, WAFER, SEMICONDUCTOR COMPONENT WITH MEMORY CELL HAVING INSULATION COLLARS AND METHOD FOR FABRICATING AN INSULATING COLLAR FOR A MEMORY CELL

BACKGROUND OF THE INVENTION

Field of the Invention

The invention relates to a memory cell formed with a trench filled with conductive material that is connected to a selection transistor by a connection having a vertical insulation collar. The invention also relates to a wafer having at least one memory cell of the type described above, to a semiconductor component having at least one memory cell of the type described above, and to a method for fabricating an insulating collar for a memory cell.

Memory cells for dynamic random access memories (DRAM) are known, for example, from International Publication WO 01/17019. Such memory cells have a capacitor for storing charges.

In this case, a DRAM memory cell usually has a selection transistor connected to a capacitor. The transistor has two diffusion regions (source, drain) of a first charge type (e.g. n-doped), which are separated from one another by a channel of a second charge type (e.g. p-doped). By applying suitable voltages to the gate of the selection capacitor, it is possible to control the current flow between the source and the drain via the channel, i.e. the information stored as charge in the capacitor can be read in or out.

In these known memory cells there is a problem in that parasitic transistors are present outside the memory cell, and in the event of a breakdown, this can lead to a loss of charge in the capacitor. Moreover, there is the problem that there must be a sufficient dielectric strength in order to prevent a punch-through.

In order to prevent the parasitic transistor, it is known, for example, from U.S. Pat. No. 6,027,494 to use a vertical insulation collar in the region of the connection of the selection transistor up to the capacitor. In this case, the vertical insulation collar is formed, for example, by a thick oxide layer that insulates the channel of the selection capacitor from the filling of the connection (e.g. doped polysilicon or a metal compound). The vertical insulation collar must also have a certain length in order to ensure the dielectric strength, so that the potential present can be reduced over the length.

On account of these conditions, the vertical insulation collar is relatively thick, which is an obstacle to constructing memory cells having the desired high integration density. Thus, the physical conditions necessitate forming the vertical insulation collar with a thickness of 10 to 15 nm. As a result, such a vertical insulation collar cannot be used in memory cells of the sub-70 nm generation. Only 1F (i.e. 70 nm) would be available for the connection between selection transistor and capacitor, and 30 nm is required for the vertical insulation collars. The remaining 40 nm would be available for conducting current. This narrow cross section would bring about a high resistance, which would lead to slower write and read times.

SUMMARY OF THE INVENTION

It is accordingly an object of the invention to provide a memory cell that overcomes the above-mentioned disadvantages of the prior art apparatus of this general type. In addition, it is also an object of the invention to provide a wafer, and a semiconductor component that each includes at least one inventive memory cell. It is also an object of the invention to provide a method for fabricating a lateral insulation collar for a memory cell. Additionally, it is an object of the invention to enable a high integration density, enable a sufficient dielectric strength, and efficiently suppress parasitic transistors.

With the foregoing and other objects in view there is provided, in accordance with the invention, a memory cell, including: a trench filled with a conductive material; a selection transistor; a connection connecting the conductive material to the selection transistor; and a lateral insulation collar for the trench. The connection includes a vertical insulation collar configured perpendicular to a layer sequence of the memory cell. The vertical insulation collar is connected to the lateral insulation collar. The lateral insulation collar is configured laterally with respect to the vertical insulation collar or is perpendicular to the vertical insulation collar.

With the foregoing and other objects in view there is provided, in accordance with the invention, a method for fabricating a lateral insulation collar for a memory cell. The method includes: fabricating a bottle trench and filling the bottle trench near a vertical wall; subsequently filling an upper, curved region of the bottle trench with an insulator; and subsequently anisotropically etching the upper region of the bottle trench in order to penetrate through the insulator.

By virtue of the fact that a vertical insulation collar is connected to a lateral insulation collar of the trench of a memory cell, and this lateral insulation collar essentially extends perpendicularly to the vertical insulation collar or is arranged laterally with respect to the vertical insulation collar, an additional degree of freedom in the configuration of the memory cell is achieved. In particular, the second, lateral insulation collar can serve to undertake the main part of the insulation tasks of the vertical insulation collar. However, since the insulation collar is split into two parts, the second insulation collar can be positioned where it is required.

In this case, it is advantageous if the cross section of the lateral insulation collar is rectangular or a circular segment, in particular a quarter circle. These cross sections can easily be fabricated by using deposition methods during the fabrication of the memory cells.

It is particularly advantageous if the maximum thickness of the vertical insulation collar is less than the maximum height of the lateral insulation collar. In this case, the thickness is measured relative to the layer construction of the memory cells in the horizontal direction, and the height in the vertical direction.

An advantageous refinement includes providing the vertical insulation collar with a thickness of 3 to 5 nm. The entire memory cell can thus be designed in a space-saving manner in a horizontal extent.

It is also advantageous if the height of the lateral insulation collar is chosen such that an inversion layer, which is situated in the region of the memory cell, of a parasitic transistor can essentially be suppressed. Splitting the insulation collar into two parts (vertical, lateral) results in higher margins of configurational leeway.

Furthermore, it is advantageous if the length of the vertical insulation collar is chosen such that voltage present there is less than the breakdown voltage. The dielectric strength of the entire memory cell is thus improved.

The trench is advantageously designed as a deep trench, since particularly dense memory cell arrays can thus be fabricated. It is also advantageous if the trench is designed as a bottle trench.

In the case of a likewise advantageously designed memory cell, the selection transistor is designed as a planar transistor or as a vertical transistor.

The method includes first forming a bottle trench in a substrate and filling the trench, for example, with polysilicon in the region of the vertical wall. Afterward, a filling with an insulator, in particular an oxide, is performed in the upper, curved region of the bottle trench. The filling of the bottle trench is etched anisotropically in the upper region in order to penetrate through the oxide. Thus, a lateral insulation collar with a circular-segment cross section, in particular a quarter-circle cross section, is formed in a simple manner on the upper shoulders of the bottle trench.

Other features which are considered as characteristic for the invention are set forth in the appended claims.

Although the invention is illustrated and described herein as embodied in a memory cell, wafer, semiconductor component with memory cell and a method for fabricating an insulating collar for a memory cell, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a diagrammatic cross-sectional view of a third form of a known DRAM memory cell;

FIG. 3A is a diagrammatic cross-sectional view of a third embodiment of an inventive memory cell that is based on the known memory cell illustrated in FIG. 3.

DESCRIPTION OF THE PREFERRED EMBODIMENTS

Three inventive embodiments are illustrated below in FIGS. 1A, 2A, and 3A. In each case an analogous, known design is illustrated for elucidation purposes in FIGS. 1, 2, 3. The reference symbols are chosen uniformly in FIGS. 1, 1A, 2, 2A, 3, and 3A.

The invention is illustrated here using an individual memory cell, which is usually combined in a large number to form arrays.

Figure 1:
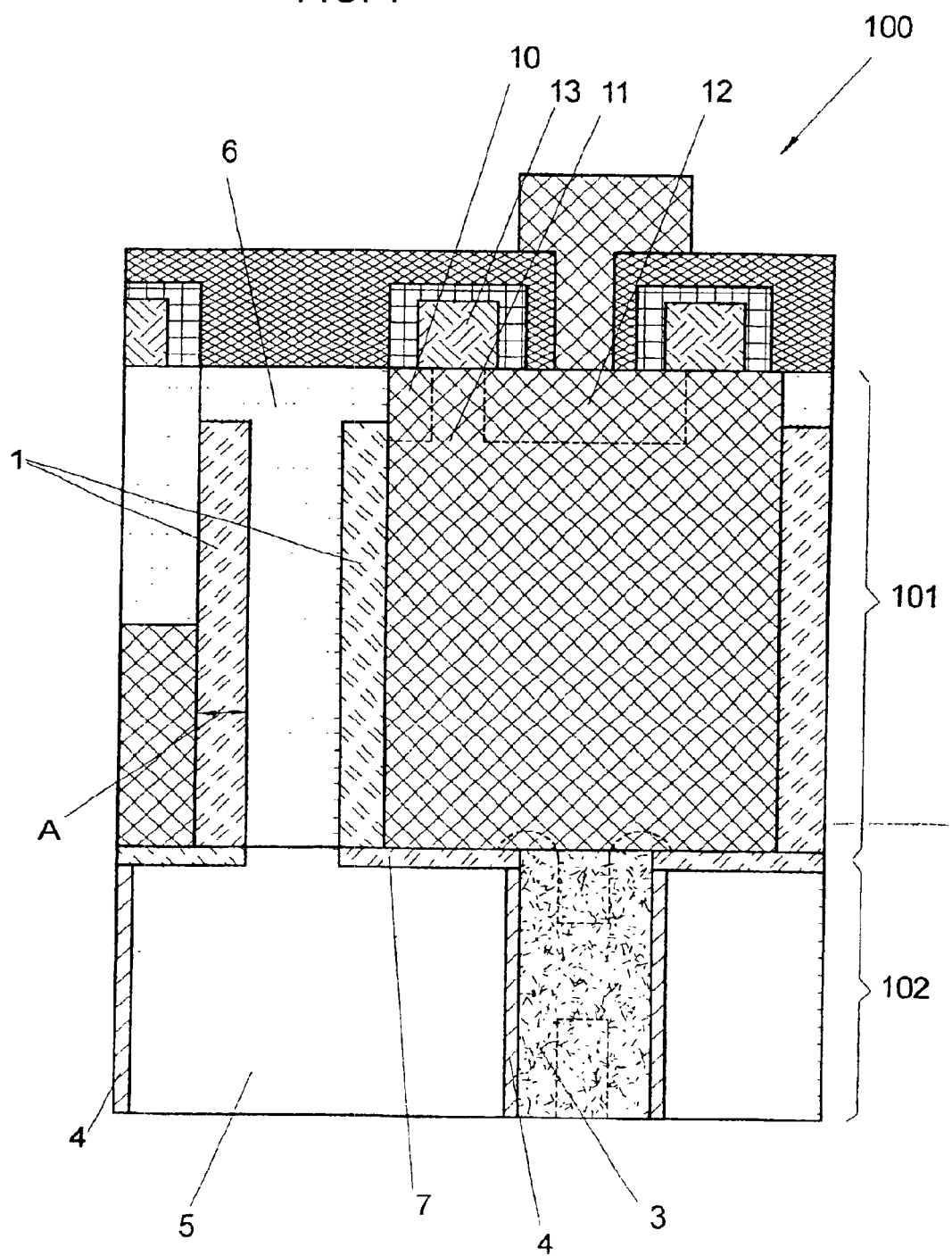
FIG. 1 is a diagrammatic cross-sectional view of a first form of a known DRAM memory cell.

Referring now to the figures of the drawing in detail and first, particularly, to FIG. 1 thereof, there is shown a memory cell 100, as is known, for example, from International Publication WO 01/17019.

In order to avoid long drawn-out passages, only the elements of the memory cell 100 which are of importance for the present invention are discussed here.

The memory cell 100 has a lower part 102 formed with a trench 5 as part of a capacitor for storing electrical charges. The trench 5 is in this case designed as a deep trench in a manner known per se and is filled e.g. with a conductive filling material such as polysilicon. Toward the top, the filling material of the trench 5 is provided with a horizontal covering layer 7.

The trench 5 is laterally surrounded by a dielectric layer 4 (e.g. an oxide layer) in order to insulate the filling material from the n-doped substrate 3.

The first electrode of the trench capacitor is formed by the filling material in the trench 5. The second electrode of the trench capacitor is formed by the region of the channel 11 and the substrate 3, which both lie outside the dielectric layer 4. The dielectric layer 4 thus isolates the two electrodes of the trench capacitor.

The control for charging or discharging the memory cell 100 (i.e. storing or reading data) is effected via a selection transistor having two n-doped diffusion regions 10, 12. In this case, the first diffusion region 10 serves as the drain and the second diffusion region serves as the source. A p-doped region serves as the channel 11 of the selection transistor. In this case, a word line 13 of a memory cell array serves as the gate of the selection transistor. A planar selection capacitor is illustrated in FIG. 1.

In the upper part 101 of the memory cell, the trench capacitor is connected to the selection transistor via a connection 6. The region of the connection 6 is filled with polysilicon, like the trench 5.

A parasitic transistor forms in the region of the memory cell 100. The parasitic transistor forms between the n-doped first diffusion region 10 (drain) and the n-doped substrate 3. The p-doped region of the channel 11 is also the channel of the parasitic transistor.

In this case, the polysilicon-filled region of the connection 6 functions as gate of the parasitic transistor. For the insulation of the region of the connection 6, the wall is lined with a vertical insulation collar 1 in the case of known memory cells 100. In this case, the vertical insulation collar 1 constitutes the gate oxide of the parasitic transistor.

The vertical insulation collar 1 has a considerable thickness A (e.g. in each case 10–15 nm), which is disadvantageous. If the vertical insulation collar 1 is too thin, charge dissipation can occur on account of the parasitic transistor, which is obviously detrimental to the function of the memory cell.

Moreover, the vertical insulation collar 1 must have a specific length in order to ensure a sufficient dielectric strength with respect to a punch-through of the memory cell 100. These relationships are explained in more detail later in connection with FIGS. 4a to 4c.

The task of this vertical insulation collar 1 is to suppress the parasitic transistor in the upper region of the memory cell 100.

Figure 1A:
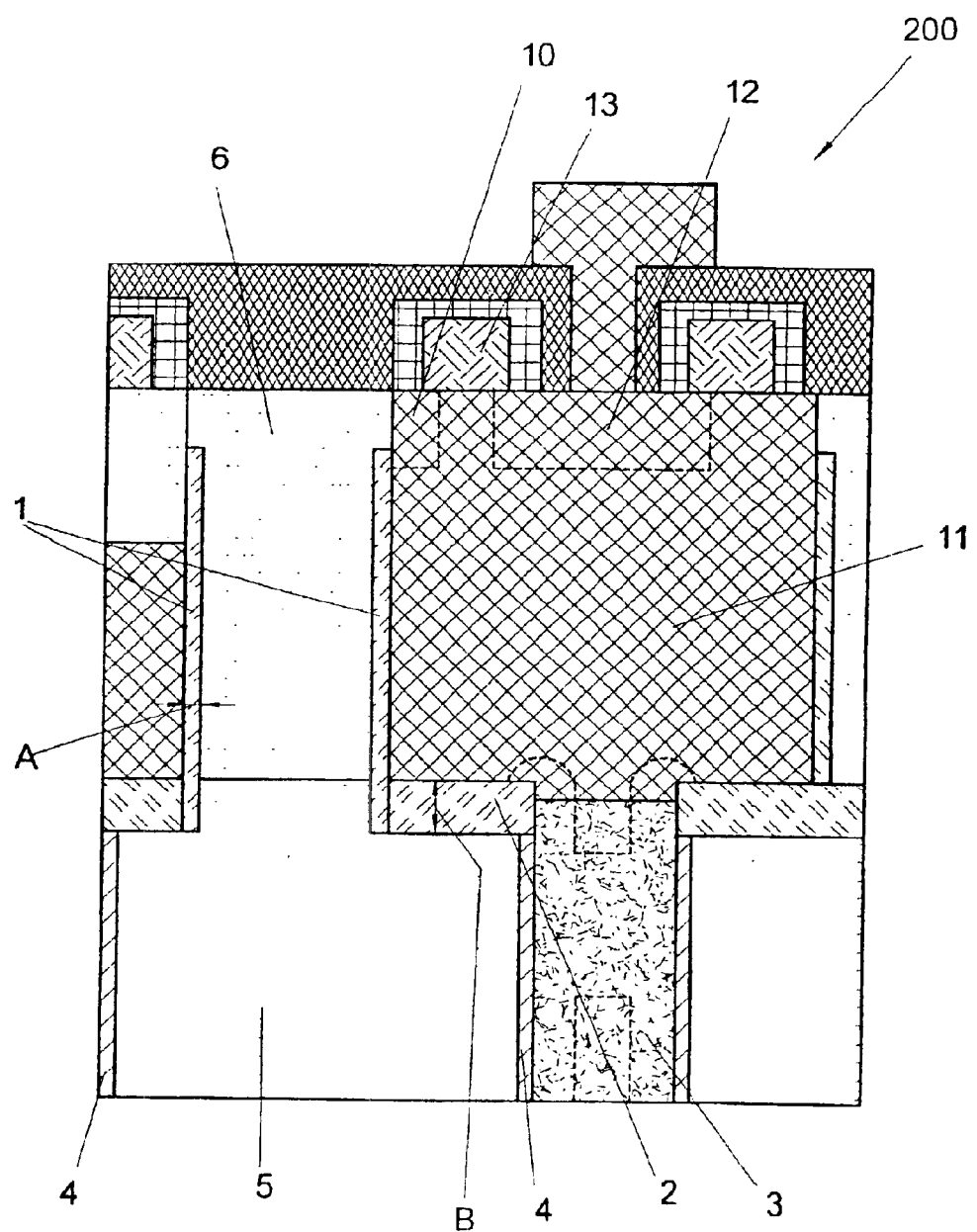
FIG. 1A is a diagrammatic cross-sectional view of a first embodiment of an inventive memory cell that is based on the known memory cell illustrated in FIG. 1.

FIG. 1A illustrates a first embodiment of an inventive memory cell 200 that is based on the known memory cell 100 illustrated in FIG. 1, so that reference can be made to the description of FIG. 1.

In the first embodiment, the vertical insulation collar 1 is connected to a lateral insulation collar 2. The lateral insulation collar 2 is arranged above the filling material of the trench 5 and is perpendicular to the vertical insulation collar 1. The lateral insulation collar 2 in this case has a rectangular cross section. The height B of the lateral insulation collar is in this case greater than the width A of the vertical insulation collar 1.

As will be explained in connection with FIG. 4, the width A in the case of the inventive configuration can be made significantly smaller (e.g. 3 to 5 nm) than compared with the known memory cell 100 (FIG. 1), so that the area requirement of such an inventive memory cell 200 in a memory cell array is smaller. The relatively large height B of the lateral insulation collar 2 does not adversely affect the space requirement of the memory cell. Rather, in the vertical direction of the trench 5, there is enough space for a configuration of the lateral insulation collar 2.

The vertical insulation collar 1 can be made thinner since the suppression of the parasitic transistor is essentially undertaken by the lateral insulation collar 2. Although, compared with the known design (FIG. 1), a somewhat thicker inversion layer of the parasitic transistor forms along the thinner vertical insulation collar 1, nevertheless the parasitic transistor is efficiently suppressed in total since the higher lateral insulation collar 2 very effectively suppresses the inversion layer. This is explained in more detail later in FIGS. 4a to 4c using an equivalent circuit diagram.

Figure 2:
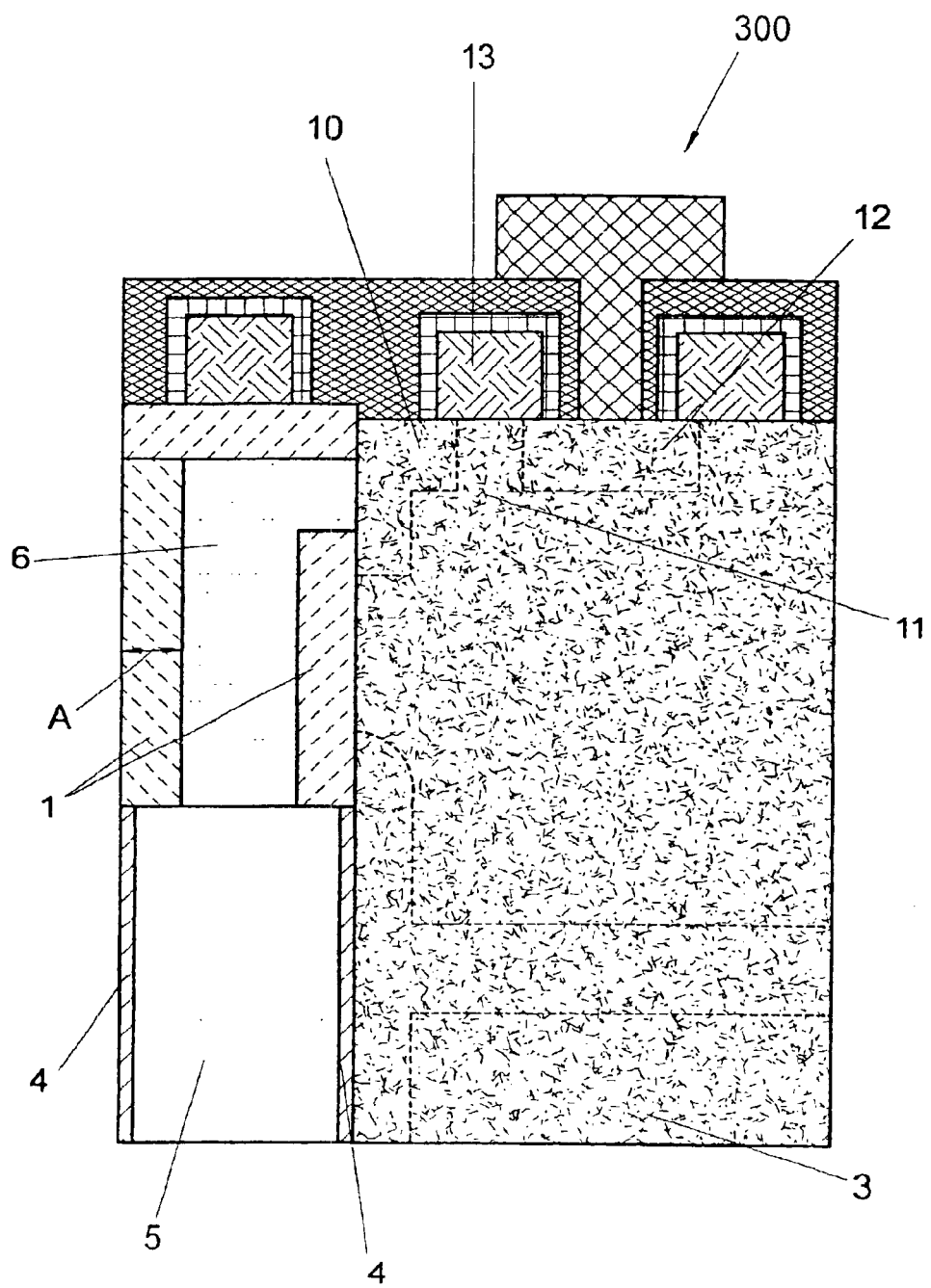
FIG. 2 is a diagrammatic cross-sectional view of a second form of a known DRAM memory cell.

FIG. 2 illustrates a memory cell 300 in which trench 5 is designed as a bottle trench. Such a configuration is known for example, from U.S. Pat. No. 6,190,988. In this case, too, the vertical insulation collar 1 is made very thick in order to suppress the parasitic transistor. As in FIGS. 1 and 1A, the selection transistor is in this case designed as a planar transistor.

Figure 2A:
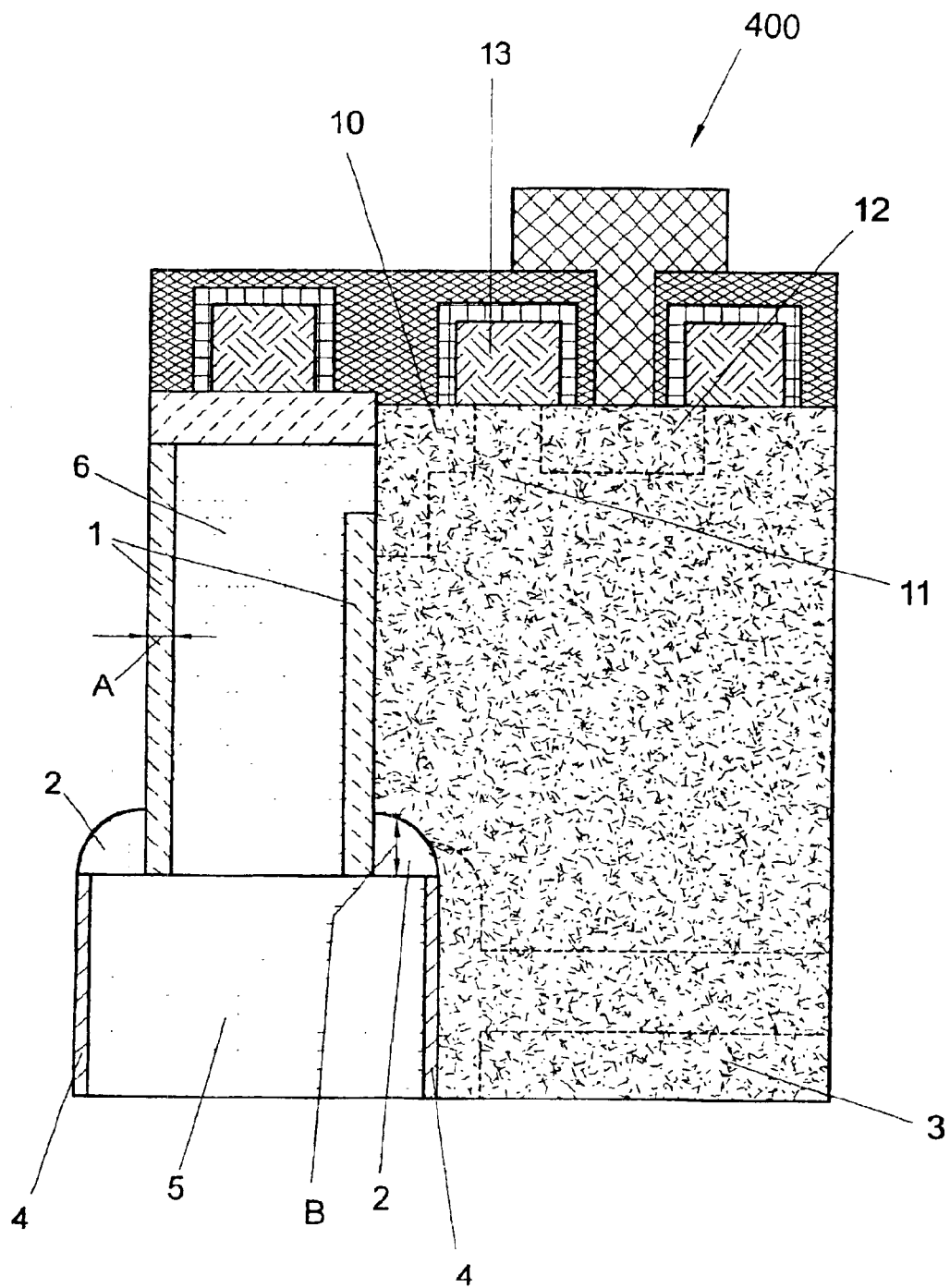
FIG. 2A is a diagrammatic cross-sectional view of a second embodiment of an inventive memory cell that is based on the known memory cell illustrated in FIG. 2.

FIG. 2A illustrates a second embodiment of the inventive memory cell 400, in which a lateral insulation collar 2 serves to suppress the parasitic transistor. In this case, the lateral insulation collar 2 lies laterally beside the vertical insulation collar 1 and is connected thereto.

In this case, the cross section of the lateral insulation collar 2 is essentially a quarter circle. The largest and also the average height B of the lateral insulation collar 2 is greater than the width A of the vertical insulation collar 1. As a result, the same advantages are afforded as in the case of the first exemplary embodiment shown in FIG. 1A.

A lateral insulation collar 2 with a quarter-circle cross section can be produced after fabricating the bottle trench. In this case, the trench is not filled up to the upper edge, i.e. the region of curvature, but rather such that the region of curvature remains free. This free space is subsequently filled with oxide and is then etched anisotropically, so that a hole with vertical walls is produced. The lateral insulation collars with a quarter-circle cross section thus remain after the etching.

Like FIG. 2, FIG. 3 illustrates a memory cell 500 in which the trench 5 is designed as a bottle trench. However, the selection transistor is in this case designed as a particularly space-saving vertical transistor.

A third embodiment of the memory cell 600 is illustrated in FIG. 3A, analogously to the previous figures. As in the second embodiment shown in FIG. 2A, the lateral insulation collar 2 is in this case made so high that the vertical insulation collar 1 can be made relatively thin.

Figure 4A:
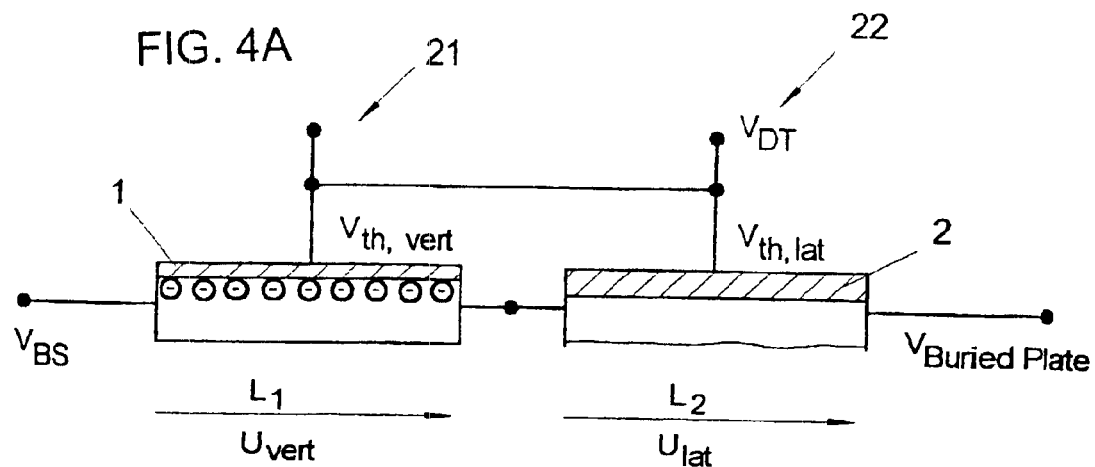
FIGS. 4A–4C show an equivalent circuit diagram for describing the function of the embodiments of the inventive memory cell.
Figure 4B:
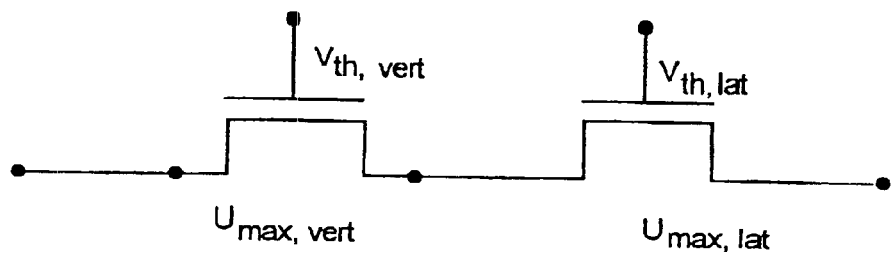
Figure 4C:
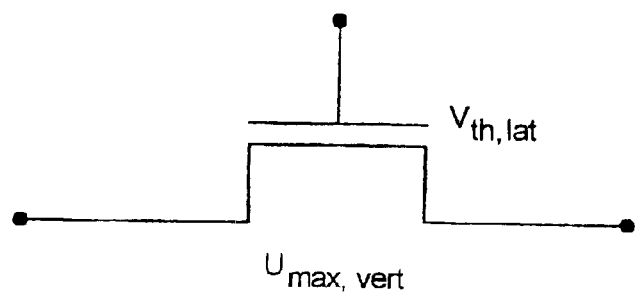

FIGS. 4A to 4C use equivalent circuit diagrams to illustrate the way in which the insulation collars 1, 2 connected according to the invention act and how a sufficient dielectric strength is produced.

In one configuration of the inventive memory cell, the length of the vertical insulation collar 1 is determined in such a way that a sufficient dielectric strength is ensured. This is because the transistor experiences a breakdown (punch-through) starting from a specific voltage. This means that an additional current path is opened parallel to the inversion channel at the silicon oxide boundary layer, which is undesirable.

In this case, the value of the breakdown voltage is greatly dependent on the channel length of the transistor. With otherwise identical boundary conditions, the value of the breakdown voltage increases with the channel length. Therefore, the aim is to choose the channel length (i.e. the length of the vertical insulation collar 1) such that the breakdown voltage is not exceeded by the voltage present.

If the transistor is operated with a source/drain voltage below the breakdown voltage, then the flow of the source/drain current is dominated by the inversion channel, i.e. by the potential of the gate. Above the breakdown voltage, the gate potential has hardly any influence on the flow of the source/drain current.

Consequently, for sufficient insulation between the source and the drain electrodes, the threshold voltage must lie above the gate voltage and the breakdown voltage must be higher than that at the terminals (source-drain) of the memory cell.

FIG. 4A illustrates the vertical insulation collar 1 when connected to the lateral insulation collar 2 leads to the suppression of the parasitic transistor.

The vertical insulation collar 1 is in this case part of a first transistor 21, and the lateral insulation collar 2 is in this case part of a second transistor 22. The first transistor 21 and the second transistor 22 are connected in series in this case. The potential $V_{DT}$ of the capacitor is present at the gates of the two transistors 21, 22.

The threshold voltages of the two transistors 21, 22 are designated by $V_{th,vert}$ for the vertical insulation collar 2 and $V_{th,lat}$ for the lateral insulation collar 2.

An undesirable dissipation of charge from the memory cell (not illustrated here) is prevented if at least one of the transistors 21, 22 brings about blocking, i.e. the voltage present at the transistors 21, 22 must be less than a breakdown voltage $U_{max}$.

On account of the relatively thin vertical insulation collar 1, an inversion layer forms at the first transistor. However, on account of the relatively high (i.e. thick) lateral insulation collar 2 (second transistor 22), the inversion layer cannot form in such a way that charge dissipation occurs overall. For this reason, no inversion layer is illustrated at the second transistor 22. Thus, overall, both transistors 21, 22 together ensure that undesirable charge dissipation is prevented.

FIG. 4B uses a circuit diagram that is simplified relative to FIG. 4A to illustrate the behavior of the voltages. Thus, on account of the longer channel length, the maximum voltage at the vertical insulation collar 1 $U_{max,vert}$ is very much greater than the maximum voltage $U_{max,lat}$ at the lateral insulation collar 2.

During operation of the memory cell, the behavior is determined by the characteristic parameters of the combination of the two transistors 21, 22, as are illustrated in FIG. 4C. The combination of the transistors 21, 22 accordingly has the threshold voltage $V_{th,lat}$ of the lateral insulation collar 2 and the voltage $U_{max,vert}$ of the vertical insulation collar 1.

The embodiment of the invention is not restricted to the preferred exemplary embodiments specified above. Rather, there are a number of conceivable variants that use the inventive memory cell, for example, a wafer having the memory cell and a semiconductor component having the memory cell. The invention also can be used with embodiments of fundamentally different configuration.

We claim:

1. A memory cell, comprising:
   a trench filled with a conductive material;
   a selection transistor;
   a connection connecting said conductive material to said selection transistor, said connection including a vertical insulation collar having a maximum thickness in a horizontal direction; and
   a lateral insulation collar for said trench, said lateral insulation collar having a maximum height in a vertical directions said maximum thickness of said vertical insulation collar being less than said maximum height of said lateral insulation collar;
   said vertical insulation collar connected to said lateral insulation collar; and
   said lateral insulation cellar configured laterally with respect to said vertical insulation collar.

2. The memory cell according to claim 1, wherein: said lateral insulation collar has a rectangular cross sectional area.

3. The memory cell according to claim 1, wherein: said lateral insulation collar has a circular cross sectional area.

4. The memory cell according to claim 1, wherein: said lateral insulation collar has a cross sectional area shaped as a quarter circle.

5. The memory cell according to claim 1, wherein: said vertical insulation collar has a thickness of 3 to 5 nm.

6. The memory cell according to claim 1, in combination with a parasitic transistor having an inversion layer near the memory cell, wherein:
   said lateral insulation collar has a height chosen such that the inversion layer of the parasitic transistor can essentially be suppressed.

7. The memory cell according to claim 1, wherein: said vertical insulation collar has a length chosen such that a voltage present at said vertical insulation collar is less than a breakdown voltage.

8. The memory cell according to claim 1, wherein: said trench is a deep trench.

9. The memory cell according to claim 1, wherein: said trench is a bottle trench.

10. The memory cell according to claim 1, wherein: said selection transistor is a planar transistor.

11. The memory cell according to claim 1, wherein: said selection transistor is a vertical transistor.

12. A memory cell, comprising:
    a trench filled with a conductive material;
    a selection transistor;
    a connection connecting said conductive material to said selection transistor, said connection including a vertical insulation collar having a maximum thickness in a horizontal direction; and
    a lateral insulation collar for said trench, said lateral insulation collar having a maximum height in a vertical direction, said maximum thickness of said vertical insulation collar being less than said maximum height of said lateral insulation collar;
    said vertical insulation collar connected to said lateral insulation collar; and
    said lateral insulation collar essentially extending perpendicular to said vertical insulation collar.

13. The memory cell according to claim 12, wherein: said lateral insulation collar has a rectangular cross sectional area.

14. The memory cell according to claim 12, wherein: said lateral insulation collar has a circular cross sectional area.

15. The memory cell according to claim 12, wherein: maid lateral insulation collar has a cross sectional area shaped as a quarter circle.

16. The memory cell according to claim 12, wherein: said vertical insulation collar has a thickness of 3 to 5 nm.

17. The memory cell according to claim 12, in combination with p parasitic transistor having an inversion layer near the memory cell, wherein:
    said lateral insulation collar has a height chosen such that the inversion layer of the parasitic transistor can essentially be suppressed.

18. The memory cell according to claim 12, wherein: said vertical insulation collar has a length chosen such that a voltage present at said vertical insulation collar is less than a breakdown voltage.

19. The memory cell according to claim 12, wherein: said trench is a deep trench.

20. The memory cell according to claim 12, wherein: said trench is a bottle trench.

21. The memory cell according to claim 12, wherein: said selection transistor is a planar transistor.

22. The memory cell according to claim 12, wherein: said selection transistor is a vertical transistor.

23. A wafer, comprising at least one memory cell including:
    a trench filled with a conductive material;
    a selection transistor;
    a connection connecting said conductive material to said selection transistor, said connection including a vertical insulation collar having a maximum thickness in a horizontal direction; and
    a lateral insulation collar for said trench, said lateral insulation collar having a maximum height in a vertical direction, said maximum thickness of said vertical insulation collar being less than said maximum height of said lateral insulation collar;
    said vertical insulation collar connected to said lateral insulation collar; and
    said lateral insulation collar configured laterally with respect to said vertical insulation collar.

24. A semiconductor component, comprising at least one memory cell including:
    a trench filled with a conductive material;
    a selection transistor;
    a connection connecting said conductive material to said selection transistor, said connection including a vertical insulation collar having a maximum thickness in a horizontal direction; and
    a lateral insulation collar for said trench, said lateral insulation collar having a maximum height in a vertical direction, said maximum thickness of said vertical insulation collar being less than said maximum height of said lateral insulation collar;
    said vertical insulation collar connected to said lateral insulation collar; and
    said lateral insulation collar configured laterally with respect to said vertical insulation collar.

* * * * *